United States Patent
Liu et al.

(10) Patent No.: US 11,762,498 B1
(45) Date of Patent: Sep. 19, 2023

(54) TOUCH SENSOR AND MANUFACTURING METHOD THEREOF

(71) Applicant: TPK Advanced Solutions Inc., Fujian (CN)

(72) Inventors: Shao Jie Liu, Xiamen (CN); Chia Jui Lin, Taoyuan County (TW); Wei Chuan Chao, New Taipei (TW); Jian Zhang, Xiamen (CN); Longyun Zhan, Jilin (CN); Jun Hua Huang, Qingliu County (CN)

(73) Assignee: TPK Advanced Solutions Inc., Fujian (CN)

( * ) Notice: Subject to any disclaimer, the term of this patent is extended or adjusted under 35 U.S.C. 154(b) by 0 days.

(21) Appl. No.: 18/094,697

(22) Filed: Jan. 9, 2023

(51) Int. Cl.
*G06F 3/041* (2006.01)
*G03F 7/42* (2006.01)

(52) U.S. Cl.
CPC .......... *G06F 3/04164* (2019.05); *G03F 7/427* (2013.01); *G06F 2203/04103* (2013.01)

(58) Field of Classification Search
CPC ................ G06F 3/04164; G06F 7/427; G06F 2203/04103

USPC ........................................................ 345/173
See application file for complete search history.

(56) References Cited

U.S. PATENT DOCUMENTS

| 2021/0118589 A1* | 4/2021 | Ooishi | ................ | B32B 7/025 |
| 2021/0200378 A1* | 7/2021 | Wu | ................ | G06F 3/04164 |

* cited by examiner

*Primary Examiner* — Mark Edwards
(74) *Attorney, Agent, or Firm* — Cooper Legal Group, LLC

(57) ABSTRACT

A touch sensor having a visible area and a peripheral area includes a substrate, a metal nanowire layer, a transitional insulating portion, and a silver layer. The metal nanowire layer is disposed on the substrate and defines a plurality of electrode portions corresponding to the visible area and a plurality of wiring portions corresponding to the peripheral area, in which the adjacent wiring portions are spaced apart by a spaced region. The transitional insulating portion is disposed in the spaced region and adjacent and connected to a sidewall of each of the wiring portions, and a gap is between two of the transitional insulating portions that are respectively connected to the adjacent wiring portions. The silver layer is disposed on an upper surface of the wiring portions, and the silver layer and the wiring portions together constitute a plurality of peripheral traces of the touch sensor.

20 Claims, 12 Drawing Sheets

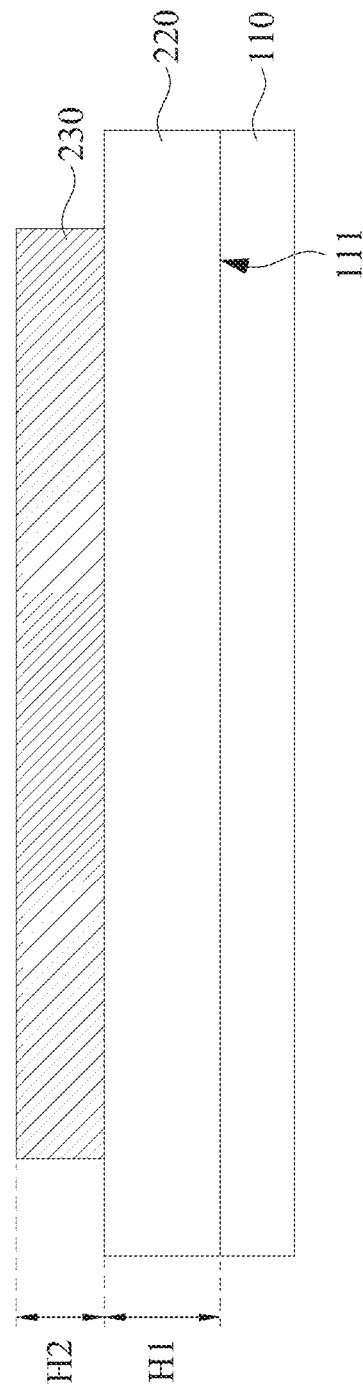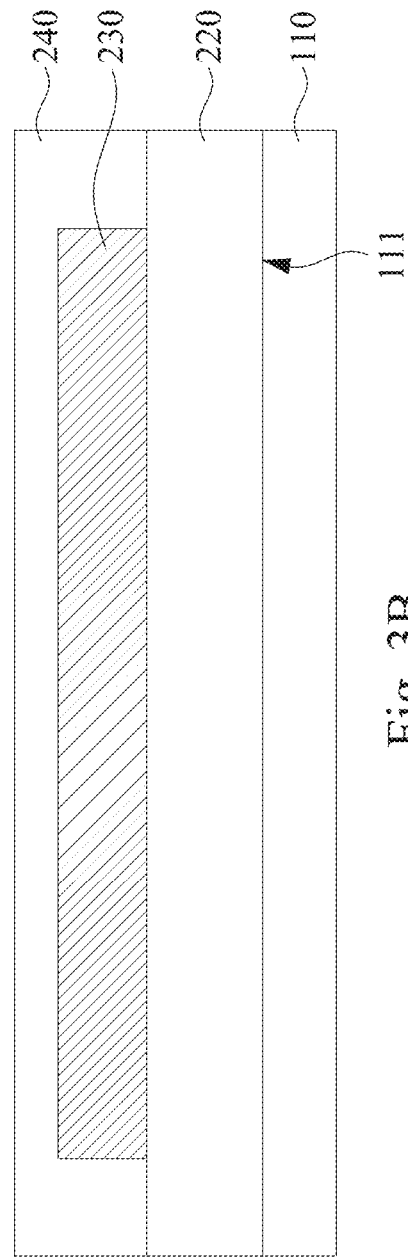

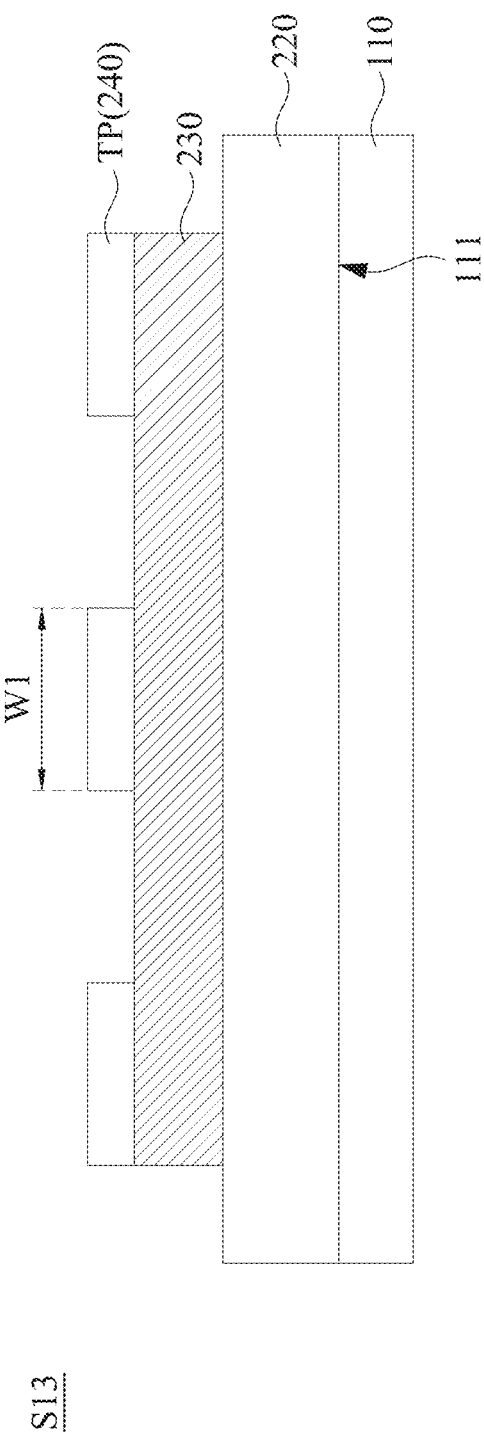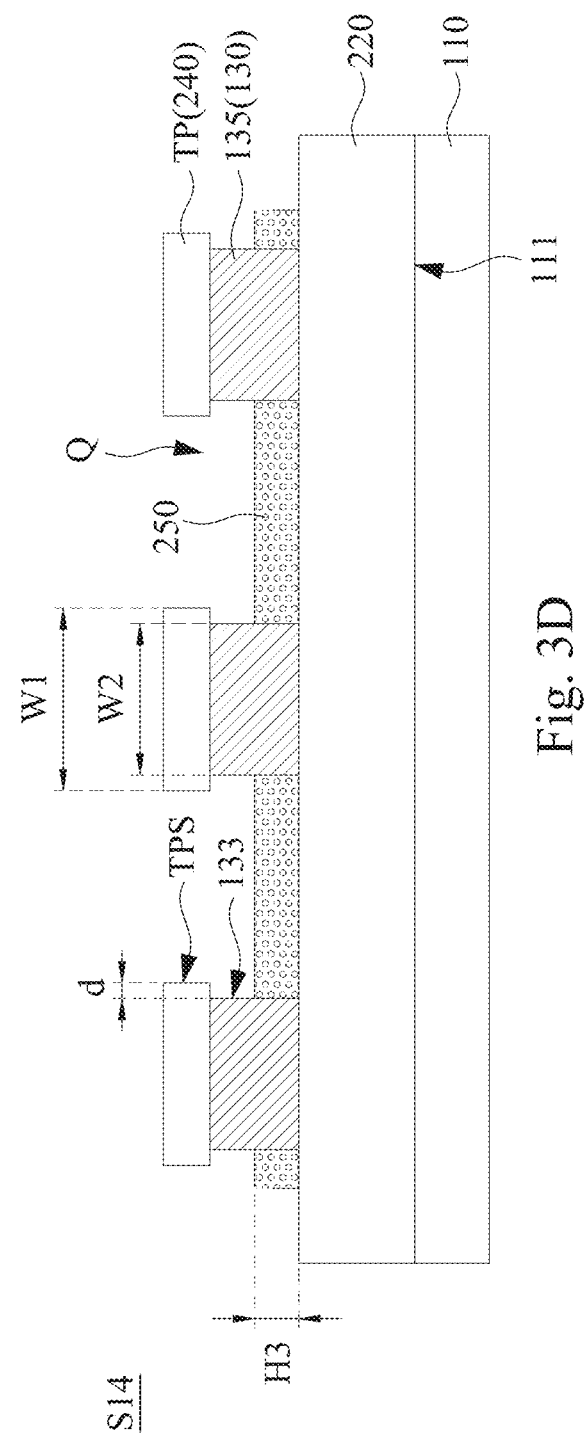

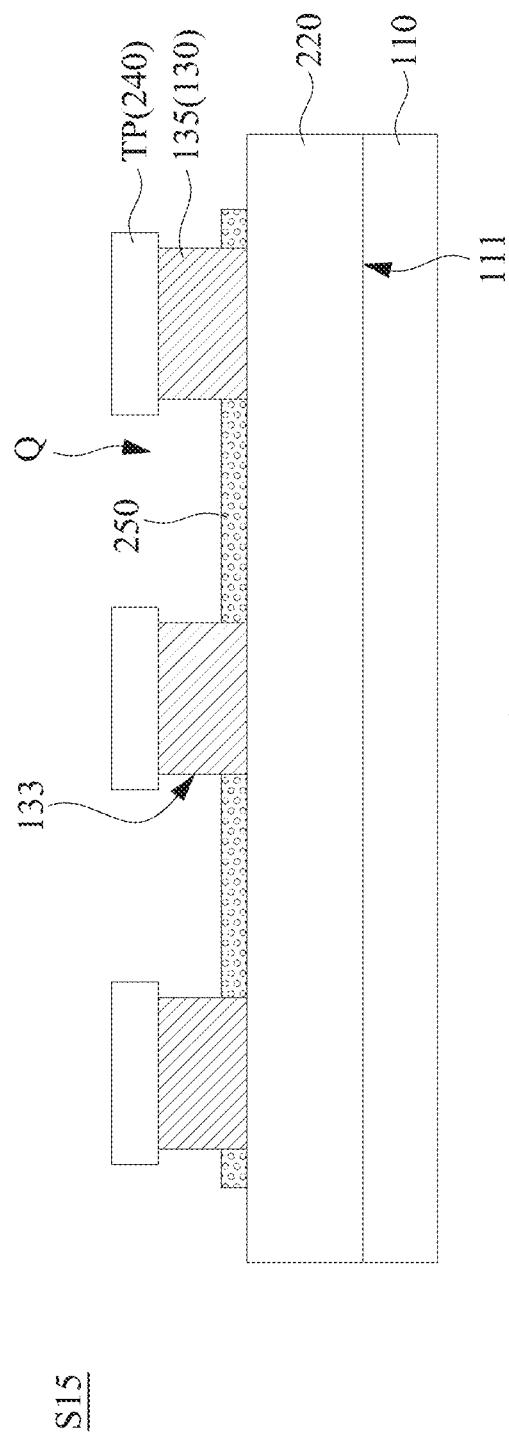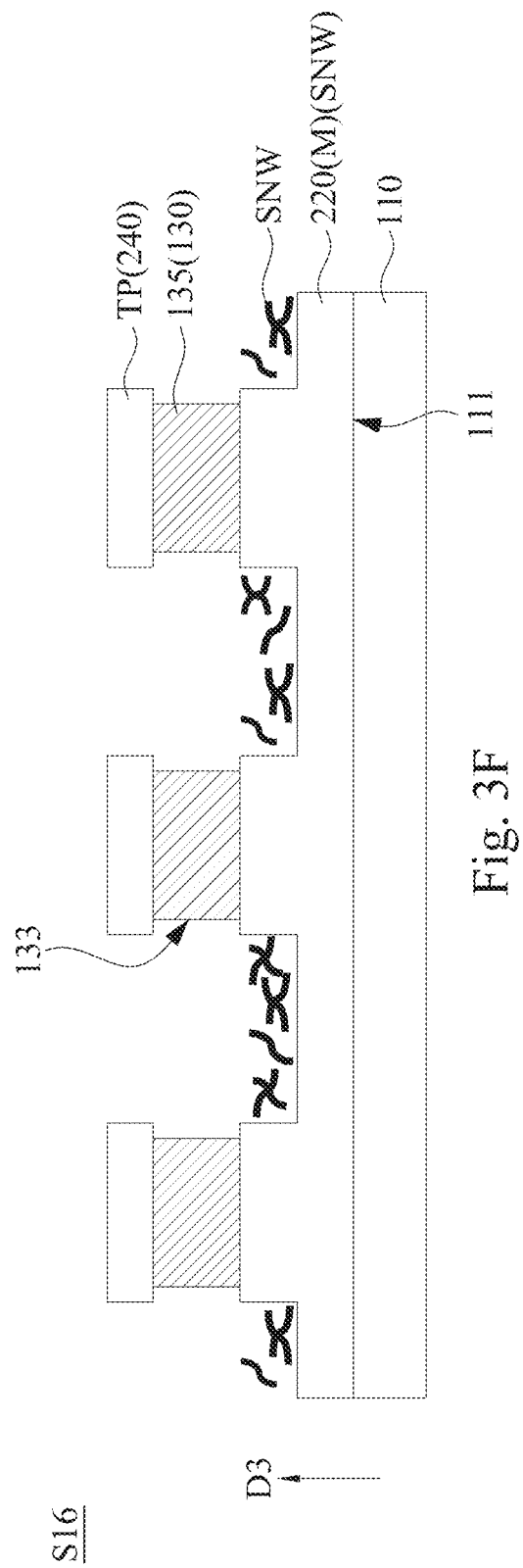

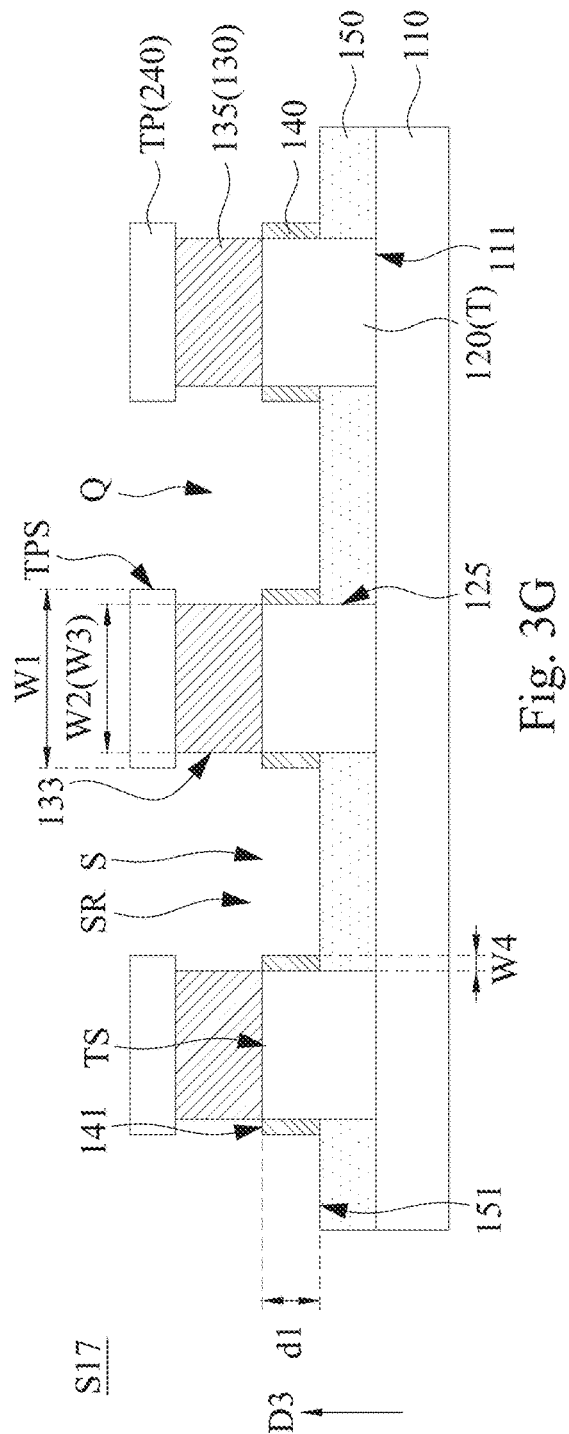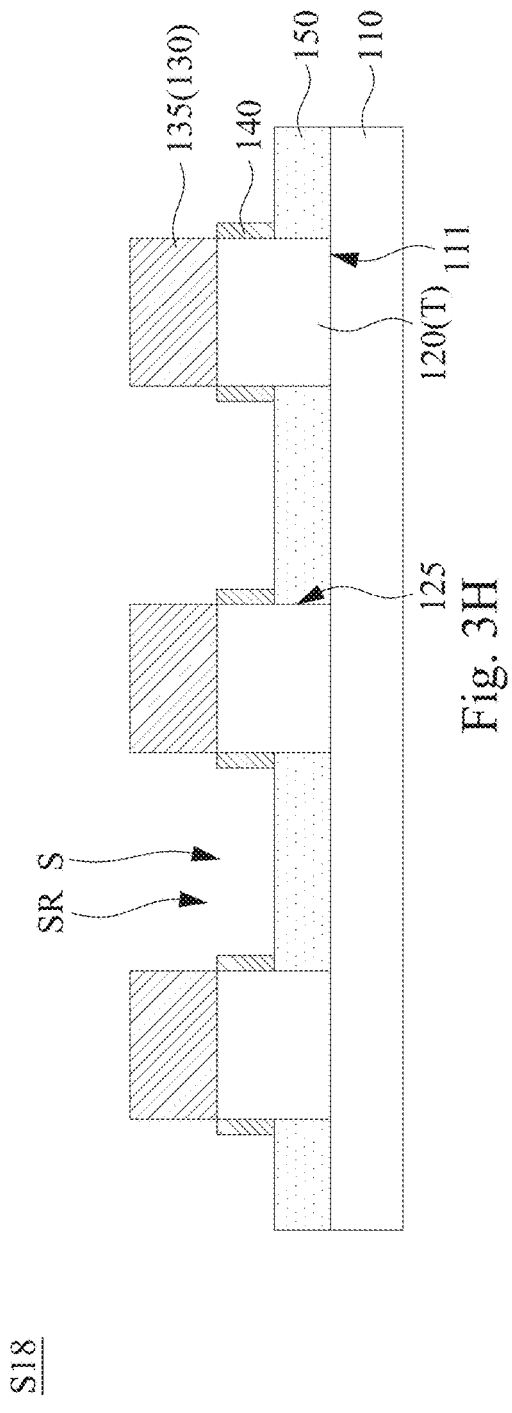

TOUCH SENSOR AND MANUFACTURING METHOD THEREOF

BACKGROUND

Field of Disclosure

The present disclosure relates to a touch sensor and a manufacturing method of a touch sensor.

Description of Related Art

In recent years, touch sensors have been widely used in portable electronic products such as mobile phones, notebook computers, satellite navigation systems, and digital audio-visual players to serve as information communication channels between users and electronic devices.

As demand for narrow bezel electronic products gradually increases, the industry is committed to improving the bendability of the electronic products and reducing the size of the bezel of electronic products to meet the needs of users. Generally, a touch sensor includes touch electrodes located in the visible area and peripheral circuits located in the peripheral area, and based on the bending requirements of the touch panel, silver paste is currently preferably used as the material for the peripheral circuits. For the silver paste material, it is common to form a silver layer from the silver paste material by performing a printing process, and to form the peripheral circuits in the peripheral area by patterning the silver layer. Also, the peripheral circuits designed in the peripheral area will affect the application of the touch panel to narrow-bezel products. Therefore, based on the use of silver paste as the material of the peripheral circuits, how to provide a touch sensor that can meet the requirements of flexibility and narrow bezel design and provide the peripheral circuits with better stability is currently worth studying.

SUMMARY

According to some embodiments of the present disclosure, a touch sensor having a visible area and a peripheral area adjacent to at least one side of the visible area includes a substrate, a metal nanowire layer, a transitional insulating portion, and a silver layer. The metal nanowire layer is disposed on a main surface of the substrate, in which the metal nanowire layer defines a plurality of electrode portions corresponding to the visible area and defines a plurality of wiring portions corresponding to the peripheral area, the wiring portions are respectively connected to the electrode portions and arranged at intervals, and two of the adjacent wiring portions are spaced apart by a spaced region. The transitional insulating portion is disposed in the spaced region, in which the transitional insulating portion is adjacent and connected to a sidewall of each of the wiring portions, and a gap is between two of the transitional insulating portions that are adjacent and respectively connected to two adjacent wiring portions of the wiring portions. The silver layer is disposed on the wiring portions and in contact with a top surface of the wiring portions, in which the silver layer and the wiring portions together constitute a plurality of peripheral traces of the touch sensor.

In some embodiments of the present disclosure, the transitional insulating portion has a plurality of pores.

In some embodiments of the present disclosure, the touch sensor further includes an insulating portion disposed in the spaced region, in which the transitional insulating portion is disposed on and in contact with a top surface of the insulating portion.

In some embodiments of the present disclosure, a surface roughness of the top surface of the insulating portion is greater than a surface roughness of a top surface of the transitional insulating portion.

In some embodiments of the present disclosure, the insulating portion and the transitional insulating portion together constitute a stepped structure.

In some embodiments of the present disclosure, a material of the transitional insulating portion is the same as a material of the insulating portion, and the insulating portion has a plurality of pores.

In some embodiments of the present disclosure, the metal nanowire layer and the transitional insulating portion include a matrix, and the metal nanowire layer includes a plurality of metal nanowires distributed in the matrix.

In some embodiments of the present disclosure, a width of the transitional insulating portion is larger than or equal to 0.25 μm and smaller than or equal to 3.5 μm.

In some embodiments of the present disclosure, the transitional insulating portion extends to a sidewall of the silver layer.

In some embodiments of the present disclosure, the touch sensor further includes a protection layer filled in the gap and covering the metal nanowire layer, the transitional insulating portion, and the silver layer.

According to some other embodiments of the present disclosure, a manufacturing method of a touch sensor having a visible area and a peripheral area adjacent to at least one side of the visible area includes: forming a metal nanowire material layer on a main surface of a substrate, in which the metal nanowire material layer corresponds to the visible area and the peripheral area; forming a silver material layer on the metal nanowire material layer and corresponding to the peripheral area; forming a photoresist layer to cover the metal nanowire material layer and the silver material layer; performing an exposure and development process to pattern the photoresist layer, in which the photoresist layer, which is patterned, defines a wiring pattern corresponding to the peripheral area; performing a first etching process to etch the silver material layer through the wiring pattern, thereby forming a silver wiring structure; performing a surface treatment process to remove at least a portion of a residual resin corresponding to the peripheral area through the wiring pattern, in which the residual resin is left by the silver material layer that has undergone the first etching process, and to remove a portion of the metal nanowire material layer corresponding to the peripheral area; performing a second etching process to etch the metal nanowire material layer through the wiring pattern, thereby forming a plurality of wiring portions, a spaced region between two adjacent wiring portions of the wiring portions, and a transitional insulating portion in the spaced region and adjacent and connected to a sidewall of each of the wiring portions; and removing the photoresist layer.

In some embodiments of the present disclosure, the first etching process is performed such that a width of the silver wiring structure is smaller than a width of the wiring pattern.

In some embodiments of the present disclosure, the surface treatment process completely removes the residual resin left by the silver material layer that has undergone the first etching process, such that a top surface of the transitional insulating portion is coplanar with an upper surface of the wiring portion.

In some embodiments of the present disclosure, the surface treatment process partially removes the residual resin left by the silver material layer that has undergone the first etching process, such that a top surface of the transitional insulating portion is higher than an upper surface of the wiring portion, and the transitional insulating portion extends to a sidewall of the silver wiring structure.

In some embodiments of the present disclosure, the metal nanowire material layer includes a matrix and a plurality of metal nanowires distributed in the matrix, and the surface treatment process completely removes the matrix of the metal nanowire material layer that is not located in a vertical projection area of the photoresist layer that is patterned, such that the substrate is exposed between the metal nanowires.

In some embodiments of the present disclosure, the transitional insulating portion extends to the main surface of the substrate.

In some embodiments of the present disclosure, the metal nanowire material layer includes a matrix and a plurality of metal nanowires distributed in the matrix, and the surface treatment process partially removes the matrix of the metal nanowire material layer that is not located in a vertical projection area of the photoresist layer that is patterned, such that the matrix that is not removed forms an insulating portion during the second etching process.

In some embodiments of the present disclosure, the second etching process is performed such that the insulating portion has a plurality of pores.

In some embodiments of the present disclosure, the surface treatment process sequentially includes a chemical cleaning process and an argon plasma treatment process.

In some embodiments of the present disclosure, the argon plasma treatment process is carried out in a direction perpendicular to the main surface of the substrate with the wiring pattern as a mask.

According to the aforementioned embodiments of the present disclosure, the design of the touch sensor of the present disclosure helps to form the peripheral traces with small line width and line spacing without degrading the electrical effect of the touch sensor. By integrally forming the electrode portion and the wiring portion to directly form an electrical connection between the touch electrode and the peripheral trace, there is no need to design an additional overlapping structure for the touch sensor. Hence, an area occupied by the overlapping structure corresponding to the peripheral area can be saved, and the overlapping tolerance will not be generated, which is beneficial to realize the narrow bezel design of the touch sensor. In addition, through the design of the transitional insulating portion, the peripheral trace formed by the overlapping of the wiring portion and the silver layer can be provided with better stability. Furthermore, based on the stacked-structure design of the touch sensor of the present disclosure, during the manufacturing process of the touch sensor, by forming the touch electrode and the peripheral trace at once through a single exposure and development process, by etching the silver material layer with the patterned photoresist layer of a suitable width due to the consideration of the side etching characteristics of the silver material layer during etching, and by removing the residual resin left by the silver material layer after the etching process, the steps of the manufacturing process can be reduced, the cost can be reduced, and the etching precision can be improved to facilitate the formation of peripheral traces with small line width and line spacing.

BRIEF DESCRIPTION OF THE DRAWINGS

The disclosure can be more fully understood by reading the following detailed description of the embodiments, with reference made to the accompanying drawings as follows:

FIG. 10 is a partially enlarged view illustrating the region R1 of the touch sensor of FIG. 1B;

FIG. 3A to FIG. 3H are schematic cross-sectional views illustrating a manufacturing method of the touch sensor of FIG. 1B in different steps;

DETAILED DESCRIPTION

Figure 1A:
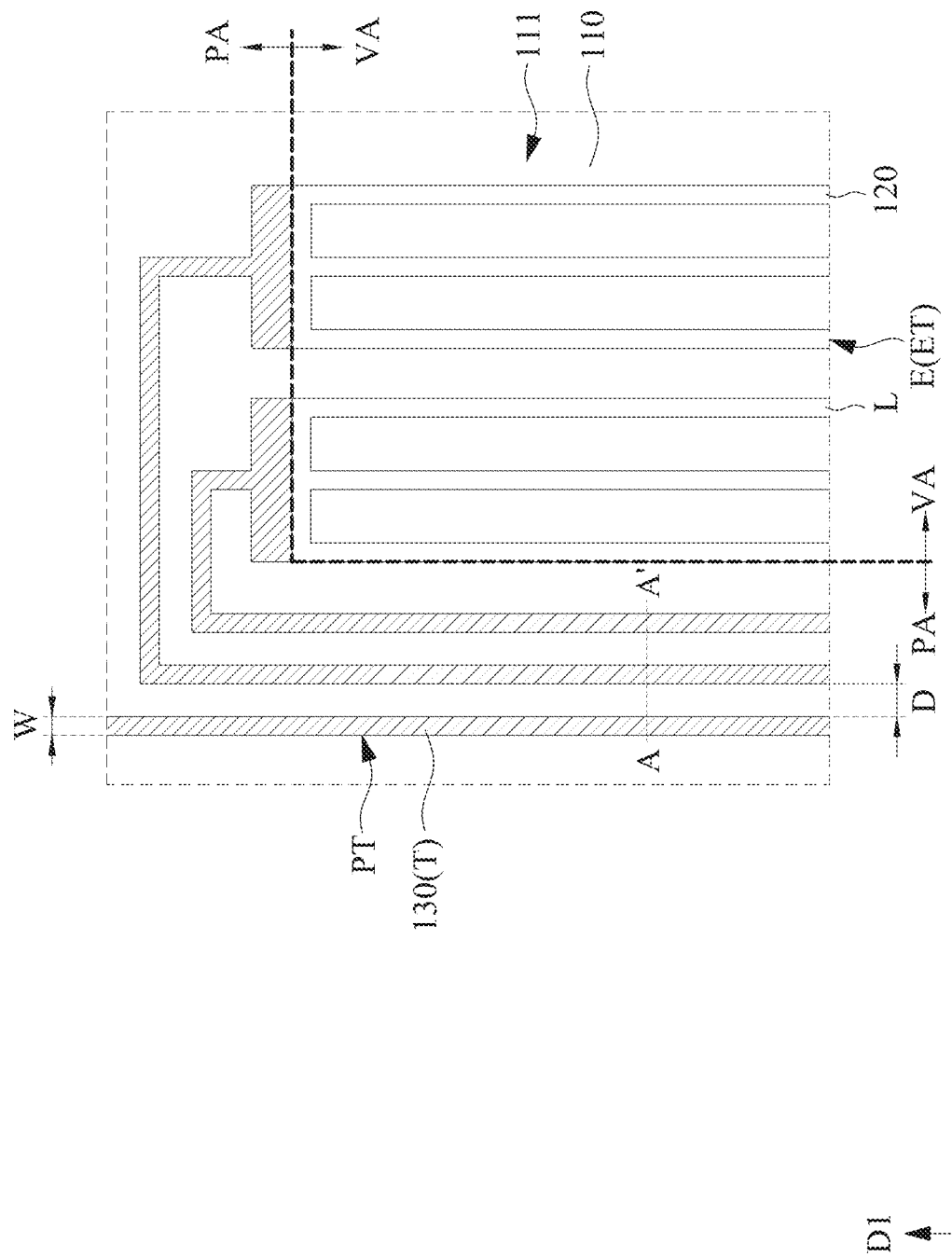
FIG. 1A is a schematic partial top view illustrating a touch sensor according to some embodiments of the present disclosure.

Reference will now be made in detail to the present embodiments of the disclosure, examples of which are illustrated in the accompanying drawings. However, it should be understood that these details should not be intend to limit the present disclosure. In addition, for the convenience of readers, the size of each element in the drawings is not illustrated according to actual scale. It should be understood that relative terms such as "lower" or "bottom" and "upper" or "top" can be used herein to describe the relationship between one element and another element, as shown in the figures. It should be understood that relative terms are intended to include different orientations of the device other than those shown in the figures.

Figure 1B:
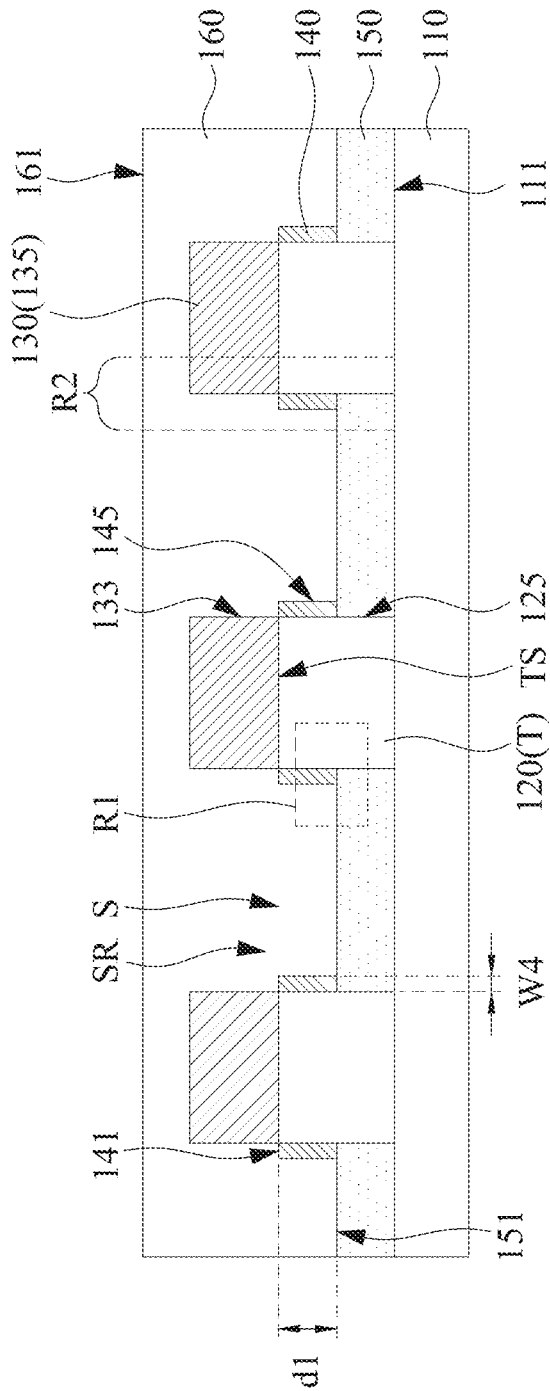
FIG. 1B is a schematic cross-sectional view illustrating the touch sensor of FIG. 1A taken along the line A-A'.
Figure 1C:
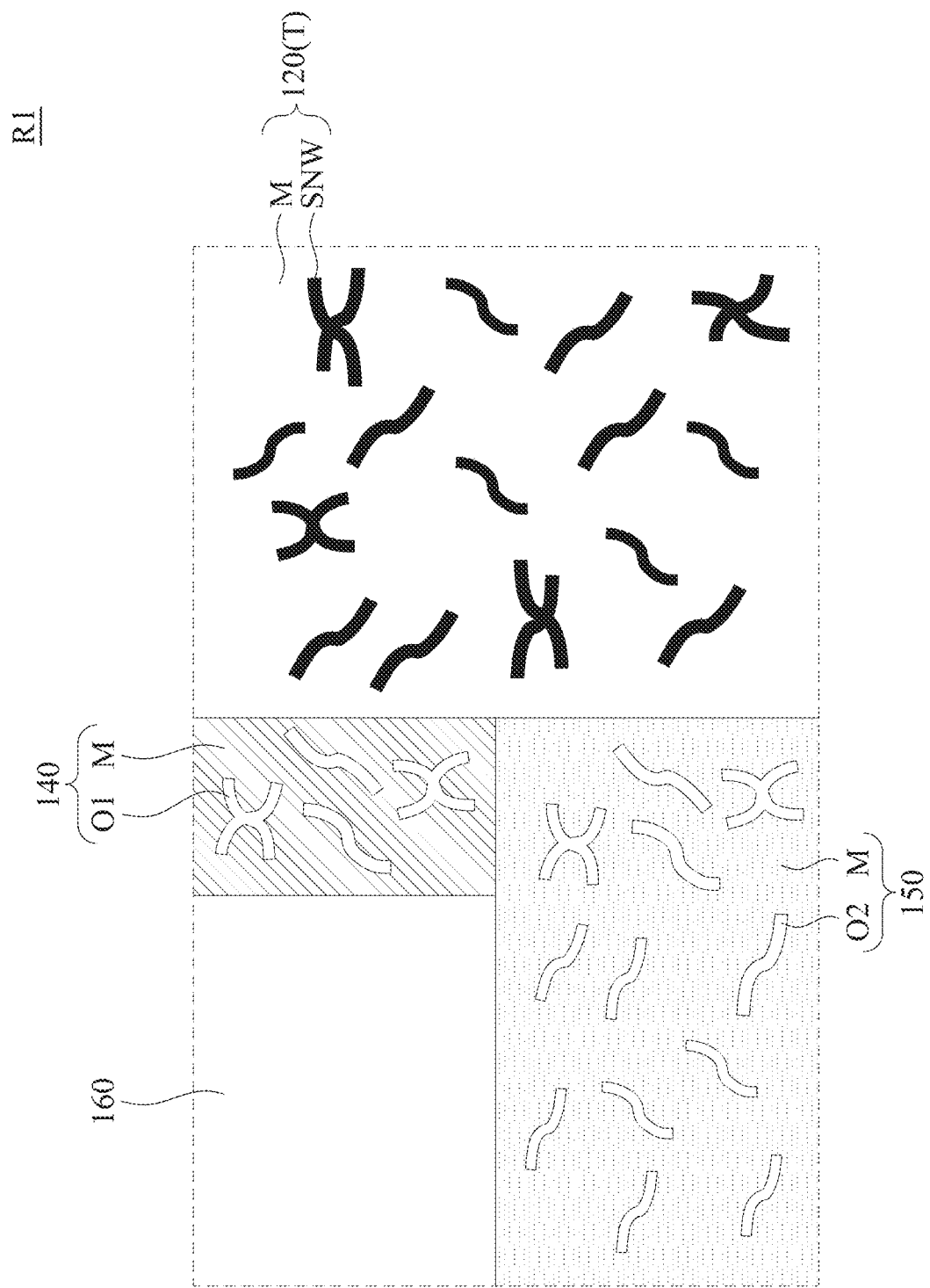

Reference is made to FIG. 1A to FIG. 10, in which FIG. 1A is a schematic partial top view illustrating a touch sensor 100 according to some embodiments of the present disclosure, FIG. 1B is a schematic cross-sectional view illustrating the touch sensor 100 of FIG. 1A taken along the line A-A', and FIG. 10 is a partially enlarged view illustrating the region R1 of the touch sensor 100 of FIG. 1B. The touch sensor 100 includes a substrate 110, a metal nanowire layer 120, a silver layer 130, and a transitional insulating portion 140. In some embodiments, the touch sensor 100 has a visible area VA and a peripheral area PA disposed on at least one side of the visible area VA. The substrate 110 has a main surface 111 configured to carry the metal nanowire layer 120, the silver layer 130, and the transitional insulating portion 140. In some embodiments, the substrate 110 may be, for example, a rigid transparent substrate or a flexible transparent substrate, and a material of the substrate 110 may include, but is not limited to, transparent materials such as glass, acrylic, polyvinyl chloride, cycloolefin polymer, cycloolefin copolymer, polypropylene, polystyrene, polycarbonate, polyethylene terephthalate, polyethylene naphthalate, colorless polyimide, or combinations thereof.

The metal nanowire layer 120 is disposed on the main surface 111 of the substrate 110 and corresponds to the visible area VA and the peripheral area PA. The metal nanowire layer 120 defines a plurality of electrode portions E corresponding to the visible area VA. That is, the electrode portions E can at least constitute a touch electrode ET of the touch sensor 100. In some embodiments, the electrode portions E may be a single-sided single-layer, double-sided single-layer, or single-sided double-layer structure disposed on the substrate 110. In the embodiment shown in FIG. 1A, the electrode portion E is an example of a single-layer electrode structure disposed on a single surface (side) of the substrate 110, in which a plurality of the electrode portions E are arranged in a non-interlaced manner. For example, the electrode portions E may be strip-shaped electrodes extending along a first direction D1 and arranged at intervals along a second direction D2, in which the first direction D1 is substantially perpendicular to the second direction D2. In some embodiments, each electrode portion E may include a plurality of electrode lines L arranged and connected in parallel. For example, in the embodiment shown in FIG. 1A, each electrode portion E includes three electrode lines L arranged and connected in parallel.

The metal nanowire layer 120 defines a plurality of wiring portions T corresponding to the peripheral area PA, in which the wiring portions T respectively connects the corresponding electrode portions E, and two adjacent wiring portions T are spaced apart by a spaced region SR. Regarding the detailed structural features of the metal nanowire layer 120, as shown in FIG. 10, the metal nanowire layer 120 may include a matrix M and a plurality of metal nanowires SNW distributed in the matrix M, in which the matrix M may include an acrylic material such as polymethylmethacrylate, and the metal nanowires SNW may include silver nanowires, gold nanowires, copper nanowires, nickel nanowires, or combinations thereof. The silver layer 130 is disposed on the main surface 111 of the substrate 110 and stacked on and in contact with the wiring portions T. In some embodiments, the silver layer 130 is stacked on and in contact with an upper surface TS of the wiring portions T to form a plurality of peripheral traces PT of the touch sensor 100. In other words, the peripheral trace PT of the present disclosure has a double-layer structure, in which the metal nanowire layer 120 is disposed relatively close to the substrate 110, and the silver layer 130 is stacked on a surface of the metal nanowire layer 120 that faces away from the substrate 110. In some embodiments, the silver layer 130 may completely overlap the wiring portions T. That is, a vertical projection of the silver layer 130 on the substrate 110 may completely overlap a vertical projection of the wiring portions T on the substrate 110.

Based on the above configuration of the metal nanowire layer 120 and the silver layer 130, an electrical connection between the touch electrode ET and the peripheral trace PT can be directly formed by integrally forming the electrode portion E and the wiring portion T. Hence, there is no need for the design of an additional overlapping structure for realizing the electrical contact between the touch electrode ET and the peripheral trace PT, such that an area occupied by the overlapping structure corresponding to the peripheral area PA can be saved, and the overlapping tolerance will not be generated, which is beneficial to meet the narrow bezel requirement of the touch sensor 100. In addition, the peripheral traces PT reduce the trace resistance of the peripheral traces PT through the overlapping of the silver layer 130 on the metal nanowire layer 120. As a supplementary note, since the peripheral traces PT are designed to be insulated from each other and arranged at intervals, the silver layer 130 of the present disclosure is only disposed on the upper surface TS of the wiring portions T to overlap the wiring portions T, thereby ensuring that a sidewall 133 of the silver layer 130 and a sidewall 125 of the wiring portions T are aligned with each other. In other words, when the silver layer 130 is stacked on the wiring portions T, the silver layer 130 will not cover the sidewall 125 of the wiring portions T, so as to prevent the line width W of the peripheral trace PT from increasing. When viewing from another perspective (e.g., from top), the silver layer 130 and the wiring portions T have substantially the same pattern.

The method of the present disclosure for manufacturing the touch sensor 100 includes a one mask etching process. That is, the peripheral area PA and the visible area VA are processed (patterned) through the same photoresist layer (mask), and the metal nanowire layer 120 and the silver layer 130 are formed through the same photoresist layer in the peripheral area PA. Therefore, for the manufacturing process of the double-layer structure located in the peripheral area PA (i.e., the structure in which the silver layer 130 is stacked on the metal nanowire layer 120), considering the side etching characteristics of the silver material layer (i.e., the material used to prepare the silver layer 130) during etching, a patterned photoresist layer with a relatively large width will be used to etch the silver material layer, and when a surface treatment process is further carried out in the peripheral area PA to remove the residual resin left by the upper silver material layer in the double-layer structure after the etching process (for more details, please refer to the following paragraphs), the touch sensor 100 of the present disclosure will be provided with a controlled structural feature on the sidewall 125 of the wiring portion T which is formed by the underlying metal nanowire material layer (i.e., the material used to prepare the metal nanowire layer 120). In more detail, in the touch sensor 100 of the present disclosure, two adjacent wiring portions T are spaced apart through the spaced region SR, in which the touch sensor 100 has a transitional insulating portion 140 located in the spaced region SR and adjacent to the sidewall 125 of each of the wiring portions T, and a gap S is between the transitional insulating portions 140 that are adjacent to two adjacent wiring portions T. That is, a gap S is between the adjacent transitional insulating portions 140 that are located in the same spaced region SR. In this embodiment, through the design of the transitional insulating portion 140, the peripheral trace PT formed by stacking the metal nanowire layer 120 on the silver layer 130 can be provided with better stability. Hence, the double-layer structure will not be peeled off when the touch sensor 100 is subjected to external forces such as bending, and can provide a better base for the silver layer 130.

As shown in FIG. 10, the transitional insulating portion 140 may include a matrix M, which is the same matrix M as in the metal nanowire layer 120, and the transitional insulating portion 140 may have a plurality of pores O1 (also referred to as the first pores O1). The cause and the related structural features of the transitional insulating portion 140 will further be described in the following paragraphs. In some embodiments, the touch sensor 100 may further include an insulating portion 150 disposed in the spaced region SR. The insulating portion 150 is in contact with the sidewalls 125 of the adjacent wiring portions T. Since the transitional insulating portion 140 is disposed on and in contact with a top surface 151 of the insulating portion 150, the top surface 151 of the insulation portion 150 is lower than a top surface 141 of the transitional insulating portion 140. The insulating portion 150 may include a matrix M, or the material of the insulating portion 150 may even be the same as the material of the transitional insulating portion 140, and the insulating portion 150 may have a plurality of pores O2 (also referred to as the second pores O2). The cause and the related structural features of the insulating portion 150 will further be described in the following paragraphs.

The structural feature of the transitional insulating portion 140 of the touch sensor 100 of the present disclosure is further described below through the description of the manufacturing process.

Figure 2:
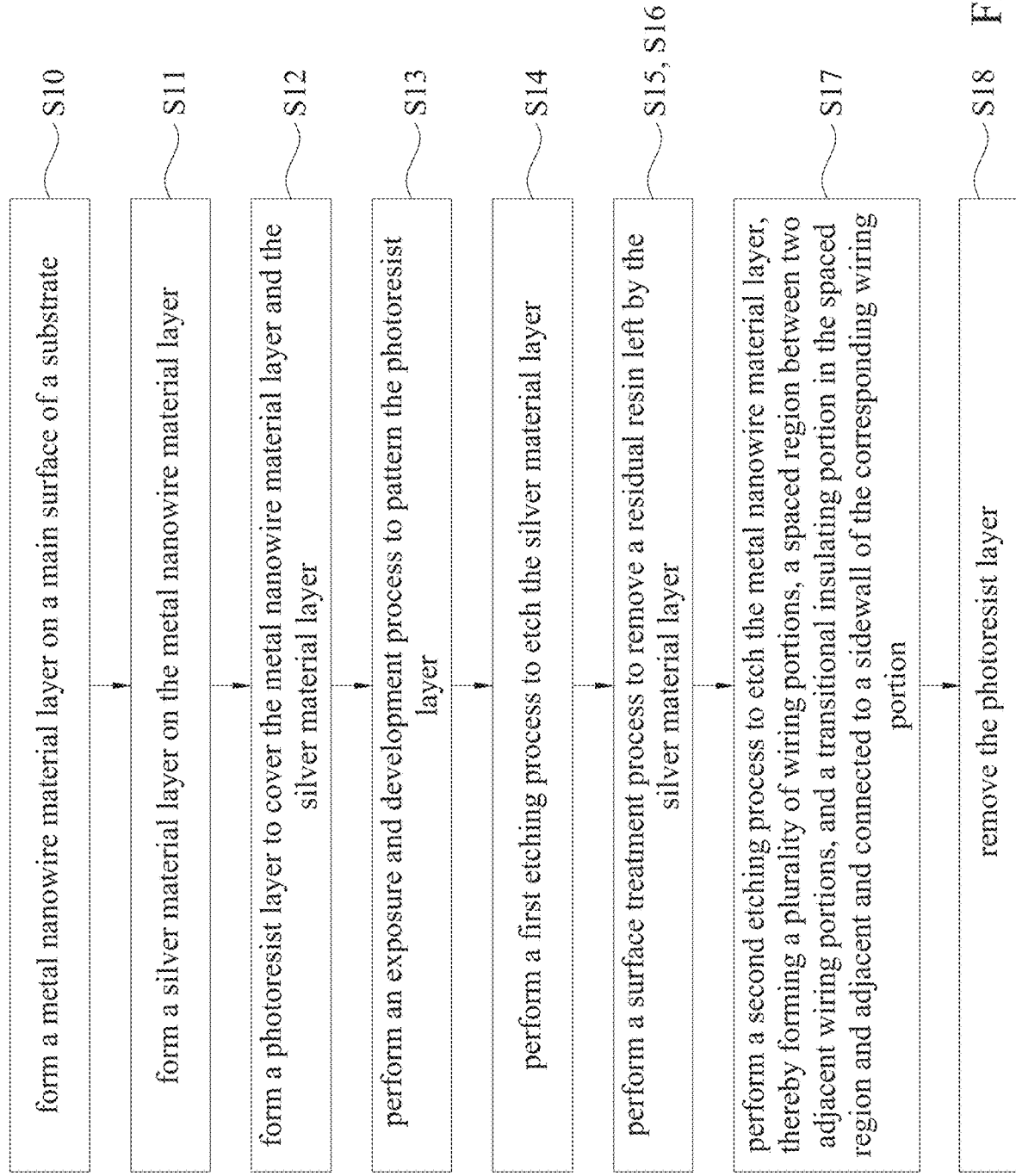
FIG. 2 is a flow chart illustrating a manufacturing method of a touch sensor according to some embodiments of the present disclosure.
Figure 4:
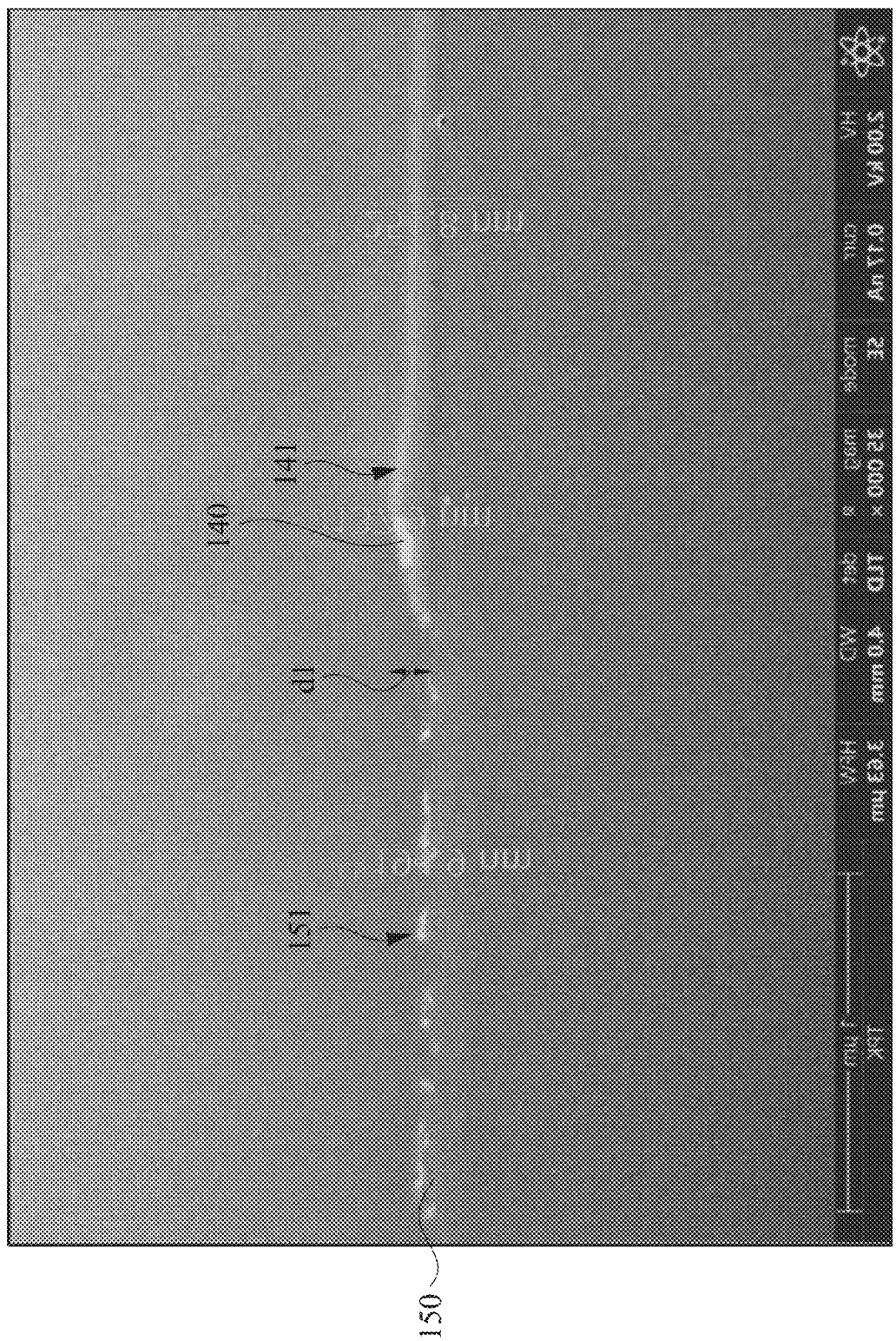
FIG. 4 is a focused ion beam scanning electron microscope (FIB-SEM) image of the region R2 of the touch sensor of FIG. 1B according to some embodiments of the present disclosure.
Figure 5:
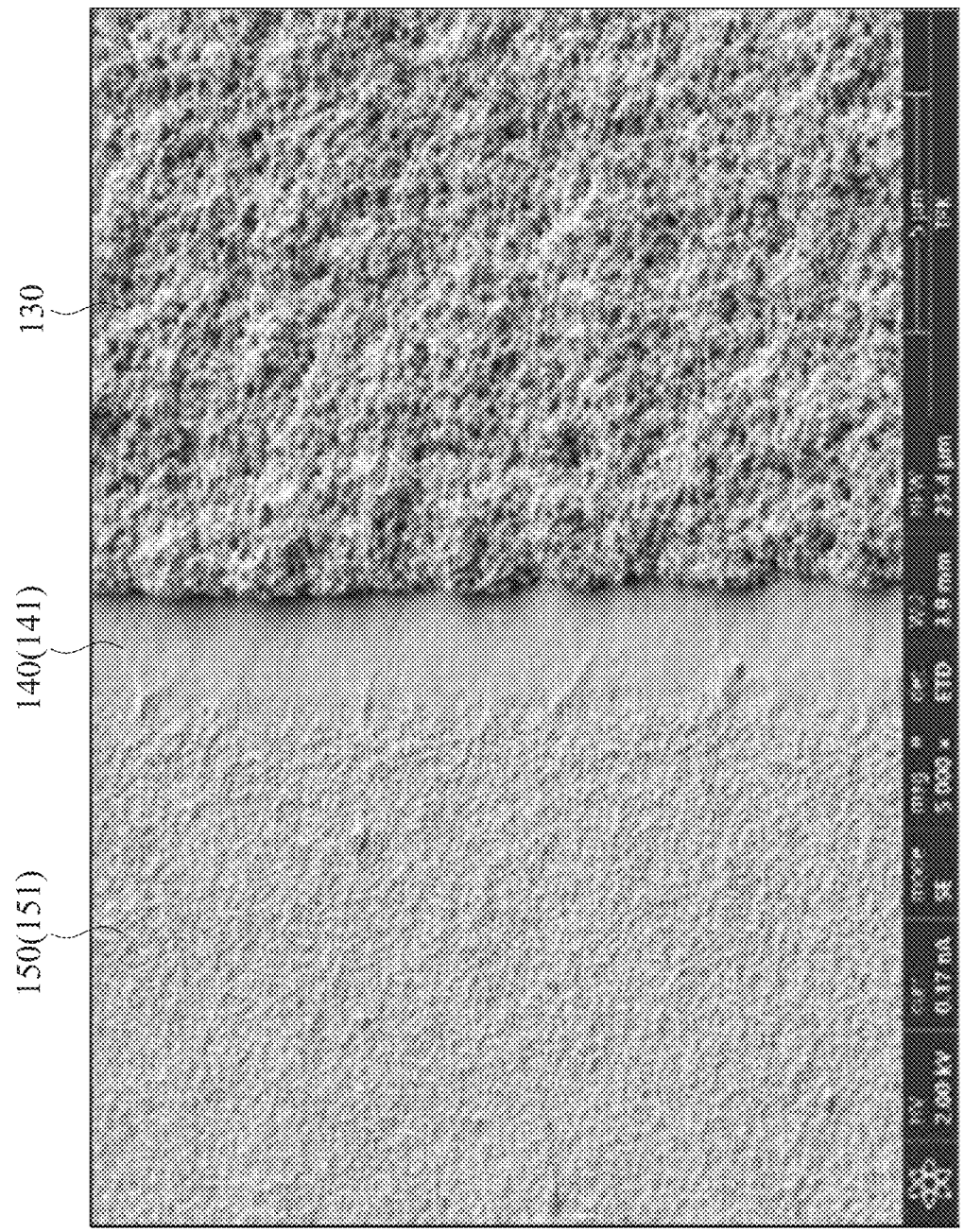
FIG. 5 is a scanning electron microscope (SEM) image of the region R2 of the touch sensor of FIG. 1B according to some embodiments of the present disclosure.

Reference is made to FIG. 2, which illustrates a flow chart illustrating a manufacturing method of a touch sensor 100 according to some embodiments of the present disclosure. In the following description, the steps shown in FIG. 3A to FIG. 3H are taken as examples to describe the manufacturing method of a touch sensor 100, in which FIG. 3A to FIG. 3H are schematic cross-sectional views illustrating a manufacturing method of the touch sensor 100 of FIG. 1A to FIG. 10 in different steps. The manufacturing method of the touch sensor 100 includes step S10 to step S18, in which the step S10 to the step S18 may be performed in sequence.

Firstly, reference is made to FIG. 3A. In step S10, a metal nanowire material layer 220 is formed on a main surface 111 of a substrate 110, in which the metal nanowire material layer 220 corresponds to the visible area VA and the peripheral area PA. Specifically, a dispersion or slurry at least including metal nanowires and a matrix can be formed on the main surface 111 of the substrate 110 through processes such as screen printing, nozzle coating, or roller coating, and the dispersion or slurry is then cured or dried to form the metal nanowire material layer 220 disposed on the main surface 111 of the substrate 110. In some embodiments, a roll-to-roll process may be performed, such that the dispersion or slurry coated on the main surface 111 of the substrate 110 is supplied continuously. In some embodiments, pretreatments may be performed on the main surface 111 of the substrate 110 before the metal nanowire material layer 220 is formed. For example, a surface modification process (e.g., surface hardening modification process) is performed or a functional coating layer (e.g., hard coating layer, adhesive layer, or resin layer) is additionally coated on the main surface 111 of the substrate 110 to enhance the adhesion between the substrate 110 and other layers. In some embodiments, for the touch sensor 100 with a surface resistance requirement of 30Ω per square, a thickness H1 of the metal nanowire material layer 220 can be designed to be greater than or equal to 40 nm and less than or equal to 50 nm. In detail, if the thickness H1 of the metal nanowire material layer 220 is greater than 50 nm, the optical properties (e.g., yellowness, which also refers to the b* value in the LAB color space) of the metal nanowire material layer 220 may have difficulty meeting the requirements, and it may lead to high contact resistance between the metal nanowire material layer 220 and the subsequently disposed silver material layer 230; if the thickness H1 of the metal nanowire material layer 220 is less than 40 nm, the anti-ultraviolet function of the touch sensor 100 may be insufficient.

Then, reference is still made to FIG. 3A. In step S11, a screen-printing process is performed to form a silver material layer 230 on the metal nanowire material layer 220, in which the silver material layer 230 corresponds to the peripheral area PA. Specifically, a silver paste material can be formed on the substrate 110 through a screen-printing process, in which the silver material layer 230 corresponds to the peripheral area PA to cover the metal nanowire material layer 220 corresponding to the peripheral area PA, and the silver paste material is then cured or dried to form the silver material layer 230. In some embodiments, a thickness H2 of the silver material layer 230 can be controlled to be greater than or equal to 400 nm and less than or equal to 600 nm. As such, it can reduce the possibility of the silver material layer 230 peeling off after the entire process due to the excessively small thickness H2. Also, it can prevent the silver material layer 230 from retaining too much residual resin after the subsequent etching process due to the excessively large thickness H2, resulting in a low etching precision of the metal nanowire material layer 220 when the metal nanowire material layer 220 is subsequently etched, such that the line width W1 and the line spacing D of the peripheral trace PT are unable to be reduced, leaving difficulties in realizing the narrow bezel requirement of the touch sensor 100.

Next, reference is made to FIG. 3B. In step S12, a photoresist layer 240 is formed on the main surface 111 of the substrate 110 to entirely cover the metal nanowire material layer 220 and the silver material layer 230. Then, reference is made to FIG. 3C. In step S13, an exposure and development process is performed, such that the photoresist layer 240 is patterned. In detail, the desired patterns to be formed on the metal nanowire material layer 220 and the silver material layer 230 are formed at once on a single photoresist layer 240 through a single exposure and development process, so as to reduce the steps and costs of the manufacturing process. In some embodiments, the photoresist layer 240 defines an electrode pattern (not shown) corresponding to the visible area VA and a wiring pattern TP corresponding to the peripheral area PA. The electrode pattern and the wiring pattern TP of the patterned photoresist layer 240 can be transferred to the metal nanowire material layer 220 and the silver material layer 230 in the subsequent etching process, so as to form the metal nanowire layer 120 including the electrode portion E and the wiring portion T as well as the silver layer 130 stacked on and in contact with the wiring portion T (for specific configuration, please refer to FIG. 1B) after the subsequent removal of the photoresist layer 240.

Subsequently, reference is made to FIG. 3D. In step S14, a first etching process is performed, such that the silver material layer 230 corresponding to the peripheral area PA is patterned to be provided with a desired pattern. In detail, the silver material layer 230 can be patterned through the wiring pattern TP to be provided with a pattern that is conformal with the pattern of the wiring pattern TP, thereby forming a silver layer 130 including a plurality of silver wiring structures 135. As shown in FIG. 3D, after the first etching process, the sidewall 133 of the silver wiring structure 135 is recessed from a sidewall TPS of the wiring pattern TP. In some embodiments, a concave depth of the sidewall 133 of the silver wiring structure 135 (i.e., a horizontal distance d between the sidewall 133 of the silver wiring structure 135 and the sidewall TPS of the wiring pattern TP) can be larger than or equal to 0.25 μm and smaller than or equal to 3.5 μm. That is, the degree of side etching of the silver material layer 230 by the first etching process is not too severe and still controllable. In some embodiments, the main components of the etching solution for etching the silver material layer 230 may include ferric chloride, which can selectively etch the silver material layer 230 without etching the metal nanowire material layer 220 below the silver material layer 230. In some embodiments, the etching depth of the first etching process for the silver material layer 230 can be adjusted, for example, by the control of time.

It is worth mentioning that, as shown in FIG. 3D, after the silver material layer 230 is etched, there is usually a residue 250, such as resin, remaining in the etching region Q. In order not to allow the residue 250 to affect the etching precision of the subsequent metal nanowire material layer 220, which results in the line width W and the line spacing D between the peripheral traces PT not being able to effectively reduced to meet the requirements, in some embodiments, step S15 can be carried out. Reference is made to FIG. 3E. A chemical cleaning process is performed, such that a pre-treatment is carried out on the patterned silver material layer 230 (silver layer 130) through the wiring pattern TP. More specifically, the residue 250 left by the silver material layer 230 that has undergone the first etching process corresponding to the peripheral area PA is initially removed. Overall, a thickness H3 (see FIG. 3D) of the residue 250 left in the etching region Q after the first etching process of the silver material layer 230 is related to the initial thickness H2 (see FIG. 3A) of the silver material layer 230. In general, the thickness H3 of the residue 250 left in the etching region Q after the first etching process of the silver material layer 230 is about 20% of the initial thickness H2 of the silver material layer 230. Therefore, as mentioned above, the thickness H2 of the silver material layer 230 is controlled to be less than or equal to 600 nm to prevent the silver material layer 230 from leaving too much residue 250 after the subsequent etching process due to the excessively large thickness H2. In some embodiments, during the chemical cleaning process, a surface treatment is performed on the silver material layer 230 by a chemical cleaning agent that can remove the resin for about 40 seconds at an ambient temperature of about 45° C. with a showerhead pressure of about 0.2 MPa.

As shown in FIG. 3E, after the chemical cleaning process, the residue 250 in the etching area Q can be greatly removed. However, since the chemical cleaning process removes the residue 250 through chemical reaction, the residue 250 cannot be removed after the chemical equilibrium is reached. Therefore, there may still be some residue 250 in the etching region Q that cannot be removed. For example, in some embodiments, when the silver material layer 230 is formed with a thickness H2 of about 1.5 μm, the thickness H3 of the residue 250 left in the etching region Q may be about 300 nm after the first etching process in step S14 (FIG. 3D), and the thickness of residue 250 left in the etching region Q may be reduced to about 50 nm after the chemical cleaning process in step S15 (FIG. 3E).

Next, in order to remove the residue 250 more completely to improve the etching precision of the metal nanowire material layer 220, the method proceeds to step S16. Reference is made to FIG. 3F. An argon plasma treatment process is performed to further process the patterned silver material layer 230 through the wiring pattern TP. More specifically, the argon plasma treatment process is performed on the residue 250 in the etching region Q of the peripheral area PA, such that the residue 250 left by the silver material layer 230 that has undergone the first etching process is completely removed. Since the argon plasma treatment process is non-selective, all surfaces exposed to the treatment environment will be physically removed. As a result, the residue 250 can be completely removed. From another point of view, since the argon plasma treatment process is carried out in the direction D3 perpendicular to the main surface 111 of the substrate 110 with the wiring pattern TP as a mask, the residue 250 that is not located in the vertical projection area of the wiring pattern TP can be completely removed. It is worth noting that although the argon plasma treatment process is carried out in the direction D3 perpendicular to the main surface 111 of the substrate 110 with the wiring pattern TP as a mask, the residue 250 left on the sidewall 133 of the silver wiring structure 135 can still be completely removed by the argon plasma treatment process since the residue left on the sidewall 133 of the silver wiring structure 135 has already been reduced in thickness (e.g., 50 nm) due to the chemical cleaning process, and the residue 250 left on the sidewall 133 of the silver wiring structure 135 is adjacent to the boundary of the processing range of the argon plasma treatment process with merely a thickness of 0.25 μm to 3.5 μm. That is, in the direction D3 perpendicular to the main surface 111 of the substrate 110, the metal nanowire material layer 220 that is located in the vertical projection area of the wiring pattern TP but not covered by the silver wiring structure 135 will also be exposed due to the removal of the residue 250.

In step S16, the argon plasma treatment process will further remove a portion of the metal nanowire material layer 220 located in the peripheral area PA (e.g., the upper portion of the metal nanowire material layer 220 that is not located in the vertical projection area of the patterned photoresist layer 240) to facilitate the subsequent second etching process. On the other hand, in addition to removing the residue 250 in the peripheral area PA, the argon plasma treatment process also removes a portion of the metal nanowire material layer 220 in the visible area VA through the electrode pattern (not shown). It should be understood that all that is removed by the argon plasma treatment process is the matrix in the metal nanowire material layer 220. Therefore, after the argon plasma treatment process, it can be seen that the metal nanowires SNW in the metal nanowire material layer 220 are exposed in the visible area VA (not shown) and the peripheral area PA, as shown in FIG. 3F. In some embodiments, the argon plasma treatment process is performed on the residue 250 that is left by the silver material layer 230, in which the argon plasma treatment process is carried out by an argon plasma with a minimum vacuum degree of about 20 mtorr, a working vacuum degree of about 200 mtorr, a power of about 16 kW, a moving speed of the substrate 110 in the roll-to-roll process is 2 m/min, an argon flow rate of 2000 sccm (standard cubic centimeter per minute) and an oxygen flow rate of 3000 sccm.

Overall, in FIG. 3E and FIG. 3F, the touch sensor 100 is subjected to a surface treatment process including a chemical cleaning process (step S15) and an argon plasma treatment process (step S16) to at least partially remove the residue 250 left by the silver material layer 230 that has undergone the first etching process, in which the residue 250 is completely removed in the embodiment shown in FIG. 3F. As a supplementary note, the chemical cleaning process and the argon plasma treatment process can be selectively adjusted or combined according to the requirements of the etching precision in the actual manufacturing process. It is worth mentioning that a single argon plasma treatment process can remove the residue 250 with a thickness H3 (see FIG. 3D) of about 100 nm. Therefore, no matter in which order the chemical cleaning process and the argon plasma treatment process are combined, as long as the thickness H3 of the residue 250 remains about 100 nm, the residue 250 can be completely removed by the argon plasma treatment process. In addition, in some embodiments, the surface treatment process can also be designed to be treated only by the argon plasma treatment process in step S16.

Next, reference is made to FIG. 3G. In step S17, a second etching process is performed, such that the metal nanowire material layer 220 corresponding to the peripheral area PA and the visible area VA is patterned. It should be understood that all that is removed by the second etching process is the metal nanowires SNW in the metal nanowire material layer 220 instead of the matrix M. Therefore, the second etching process will completely remove the metal nanowires SNW in the metal nanowire material layer 220 in the etching region Q without having any impact on the matrix M. In some embodiments, the main components of the etching solution for etching the metal nanowire material layer 220 may include ferric chloride. In some embodiments, the etching depth of the first etching process for the metal nanowire material layer 220 can be adjusted, for example, by the control of time. Also based on the side etching characteristics of the metal nanowire material layer 220 during the etching process, the etching solution will remove the metal nanowire material layer 220 that is located in the vertical projection area of the wiring pattern TP but not covered by the silver layer 130. Therefore, during the second etching process, the metal nanowires SNW that are not located in the vertical projection area of the wiring pattern TP and exposed will be removed; the metal nanowires SNW that are not located in the vertical projection area of the wiring pattern TP but located in the matrix M will be removed; the metal nanowires SNW that are located in the vertical projection area of the wiring pattern TP, not covered by the silver layer 130, and located in the matrix M will be removed; the metal nanowires SNW that are covered by the silver layer 130 will not be removed. In this way, the second etching process can form a plurality of wiring portions T that are electrically conductive, insulated from each other, and arranged at intervals, in which two adjacent wiring portions T can be separated by the spaced region SR. Also, the second etching process can form the transitional insulating portions 140 adjacent to the sidewalls 125 of the wiring portions T in the spaced region SR, and a gap S is between the transitional insulating portions 140 adjacent to the two adjacent wiring portions T. That is, a gap S is between the adjacent transitional insulating portions 140 that are in the spaced region SR. For the wiring portion T, since the wiring portion T still includes the matrix M and the metal nanowire SNW located in the matrix M (see FIG. 10) after the second etching process, the wiring portion T can still maintain its electrical function. Also, based on the side etching characteristics of the metal nanowire material layer 220 during the etching process, the width W3 of the wiring portion T formed by the second etching process will be smaller than the width W1 of the wiring pattern TP, and the width W3 of the wiring portion T will be approximately equal to the width W2 of the silver wiring structure 135. That is, the sidewall 125 of the wiring portion T and the sidewall 133 of the silver layer 130 are aligned with each other, and the sidewall 125 of the wiring portion T is recessed from the sidewall TPS of the wiring pattern TP by 0.25 μm to 3.5 μm.

In addition, for the transitional insulating portion 140, since the transitional insulating portion 140 is formed by the metal nanowire material layer 220 that is located in the vertical projection area of the wiring pattern TP but not covered by the silver layer 130, and the metal nanowires SNW in the metal nanowire material layer 220 in such a position will be removed during the second etching process, the transitional insulating portion 140 will contain the matrix M but not the metal nanowires SNW (see FIG. 10). Furthermore, since the metal nanowires SNW are etched and removed from the cured and shaped matrix M, the transitional insulating portion 140 will have a plurality of first pores O1 left in the matrix M formed by the removal of the metal nanowires SNW. That is, the quantity of the first pores O1 is equal to the quantity of the metal nanowires SNW that are removed, and the size and profile of the first pores O1 also correspond to the size and shape of the metal nanowires SNW. More specifically, the cross-sectional dimension (e.g. diameter) of the elongated first pores O1 may be less than 500 nm, preferably less than 100 nm, more preferably larger than or equal to 30 nm and smaller than or equal to 50 nm, and the aspect ratio of the elongated first pores O1 can be greater than 10, preferably greater than 50, more preferably greater than 100.

Similarly, since the transitional insulating portion 140 is formed by the metal nanowire material layer 220 that is not covered by the silver layer 130 and in the vertical projection area of the wiring pattern TP, and the sidewall 133 of the silver layer 130 is recessed from the sidewall TPS of the wiring pattern TP on the same side by 0.25 μm to 3.5 μm, the transitional insulating portion 140 extends along the sidewall 125 of the wiring portion T formed by the metal nanowire material layer 220, and the width W4 of the transitional insulating portion 140 may be larger than or equal to 0.25 μm and smaller than or equal to 3.5 μm. In addition, since the aforementioned argon plasma treatment process completely removes the residue 250 left by the silver material layer 230 (including the residue 250 left on the sidewall 133 of the silver wiring structure 135), the top surface of the metal nanowire material layer 220 located in the vertical projection area of the wiring pattern TP but not covered by the silver wiring structure 135 will be exposed, and the top surface 141 of the transitional insulating portion 140 is substantially coplanar with the upper surface TS of the wiring portion T.

In the steps of the aforementioned argon plasma treatment process, for the metal nanowire material layer 220, the upper portion of the metal nanowire material layer 220 not located in the vertical projection area of the patterned photoresist layer 240 are partially removed, and the lower portion of the metal nanowire material layer 220 (the portion closer to the substrate 110) will still be retained after the argon plasma treatment process. Therefore, the metal nanowires SNW located in the lower portion of the metal nanowire material layer 220 will be removed during the second etching process, and the matrix M left in the metal nanowire material layer 220 will form the insulating portion 150. In detail, the insulating portion 150 is located in the spaced region SR, extends from the sidewall 125 of one wiring portion T to the sidewall 125 of the adjacent wiring portion T, and is in contact with the sidewall 125 of the wiring portion T. Based on the above structural configuration, the insulating portion 150 and the transitional insulating portion 140 form a stepped structure. That is, there is a level difference between the insulating portion 150 and the transitional insulating portion 140. In some embodiments, the level difference (i.e., a vertical distance dl between the top surface 151 of the insulating portion 150 and the top surface 141 of the transitional insulating portion 140) is larger than or equal to 100 nm and smaller than or equal to 150 nm. Specifically, reference is made to FIG. 4, which is a focused ion beam scanning electron microscope (FIB-SEM) image of the region R2 of the touch sensor 100 of FIG. 1B according to some embodiments of the present disclosure. According to the measurement of the FIB-SEM image, the vertical distance dl between the top surface 151 of the insulating portion 150 and the top surface 141 of the transitional insulating portion 140 is 137.9 nm.

On the other hand, since the metal nanowires SNW located in the lower portion of the metal nanowire material layer 220 are etched and removed from the cured and shaped matrix M, the insulating portion 150 will have a plurality of second pores O2 left in the matrix M formed by the removal of the metal nanowires SNW. Also, the quantity of the second pores O2 is equal to the quantity of the metal nanowires SNW that are removed, and the size and profile of the second pores O2 correspond to the size and shape of the metal nanowires SNW. It is worth noting that since the top surface of the metal nanowire material layer 220 used to form the insulating portion 150 will be subjected to the argon plasma treatment process, the top surface 151 of the insulating portion 150 is relatively rough; in contrast, since the top surface of the metal nanowire material layer 220 used to form the transitional insulating portion 140 will not be subjected to the argon plasma treatment process, the top surface 141 of the transitional insulating portion 140 is relatively smooth. Overall, the surface roughness of the top surface 141 of the transitional insulating portion 140 is smaller than the surface roughness of the top surface 151 of the insulating portion 150. Specifically, reference is made to FIG. 5, which is a scanning electron microscope (SEM) image of the region R2 of the touch sensor 100 of FIG. 1B according to some embodiments of the present disclosure. It can be seen from the SEM image that the top surface 151 of the insulating portion 150 has a greater graininess, while the top surface 141 of the transitional insulating portion 140 has a smaller graininess. That is, the top surface 141 of the transitional insulating portion 140 is relatively smooth.

Reference is made to FIG. 3H. In step S18, the photoresist layer 240 is removed. For the peripheral area PA, after the photoresist layer 240 is removed, it can be seen that a plurality of the wiring portions T formed by the patterned metal nanowire material layer 220 (i.e., the metal nanowire layer 120) that are arranged at intervals and the silver layer 130 that is stacked on the wiring portions T formed by the patterned silver material layer 230 are formed, in which two adjacent wiring portions T are spaced apart by the spaced region S2, a transitional insulating portion 140 is located in the spaced region SR and adjacent and connected to the sidewall 125 of the wiring portion T, and a gap S is between the adjacent transitional insulating portions 140 that are located in the same spaced region SR. In the embodiment shown in FIG. 3H, the touch sensor 100 further includes an insulating portion 150. The specific structural feature of the insulating portion 150 can be referenced above and will not be repeated hereinafter.

To sum up the above steps S13 to S18, a one mask etching process is carried out to pattern the photoresist layer to form a wiring pattern with a width slightly larger than an expected width of the wiring portion, and a surface treatment process (including the chemical cleaning process and the argon plasma treatment process) is performed between the two etching processes. Therefore, the etching precision can be improved, and a controlled structural feature (the transitional insulating part) can also be formed on the sidewall of the wiring portion. The overall process is referred to as "development," "first etching," "chemical cleaning," "argon plasma treatment," "second etching," and "stripping," which is further shortened as "DECEPS process,", in which the chemical cleaning process can be omitted depending on actual needs.

Reference is made back to FIG. 1B. In some embodiments, the touch sensor 100 may further include a protection layer 160 disposed on the main surface 111 of the substrate 110 and entirely covering the metal nanowire layer 120, the silver layer 130, and the transitional insulating portion 140. The protection layer 160 is filled in the gap S and in contact with the sidewall 145 of the transitional insulating portion 140, and the top surface 161 of the protection layer 160 is higher than the top surface 141 of the transitional insulating portion 140. In the embodiment shown in FIG. 1B, the protection layer 160 is further in contact with the top surface 151 of the insulating portion 150. In some embodiments, the protection layer 160 may include insulating resins, organic materials, or inorganic materials. For example, the protection layer 160 may include materials such as polyethylene, polypropylene, polycarbonate, polyvinyl butyral, polystyrene sulfonic acid, acrylonitrile-butadiene-styrene copolymer, poly(3,4-ethylenedioxythiophene), ceramic, or combinations thereof.

Figure 6A:
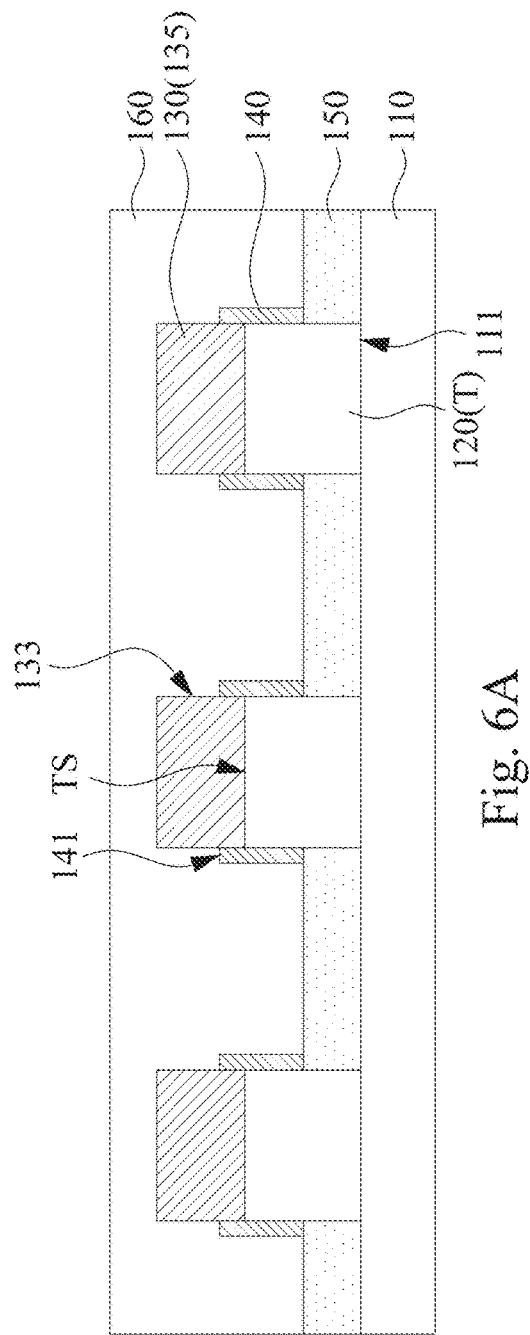
FIG. 6A to FIG. 6C are schematic cross-sectional views of touch sensors according to some other embodiments of the present disclosure, in which the cross-sectional positions of FIG. 6A to FIG. 6C correspond to the position taken along the line A-A' shown in FIG. 1A.

Reference is made to FIG. 6A, which is a schematic cross-sectional view of a touch sensor 100a according to some other embodiments of the present disclosure, in which the cross-sectional position of FIG. 6A corresponds to the position taken along the line A-A' shown in FIG. 1A. At least one difference between the touch sensor 100a shown in FIG. 6A and the touch sensor 100 shown in FIG. 1B is that in the touch sensor 100a of FIG. 6A, the transitional insulating portion 140 further extends to a portion of the sidewall 133 of the silver layer 130 (the silver wiring structure 135). In detail, in this embodiment, during the argon plasma treatment process (see FIG. 3E and FIG. 3F), the argon plasma treatment process can only partially remove the silver material layer 230 left after the first etching process. More specifically, the argon plasma treatment process does not completely remove the residue 250 adjacent to the sidewall 133 of the silver wiring structure 135. Therefore, after the second etching process (see FIG. 3G), the residue 250 adjacent to the sidewall 133 of the silver wiring structure 135 will be retained and form the transitional insulating portion 140 together with the matrix M in the metal nanowire material layer 220 that is located in the vertical projection area of the wiring pattern TP but not covered by the silver wiring structure 135, thereby forming a transitional insulating portion 140 with the top surface 141 higher than the upper surface TS of the wiring portion T.

Figure 6B:
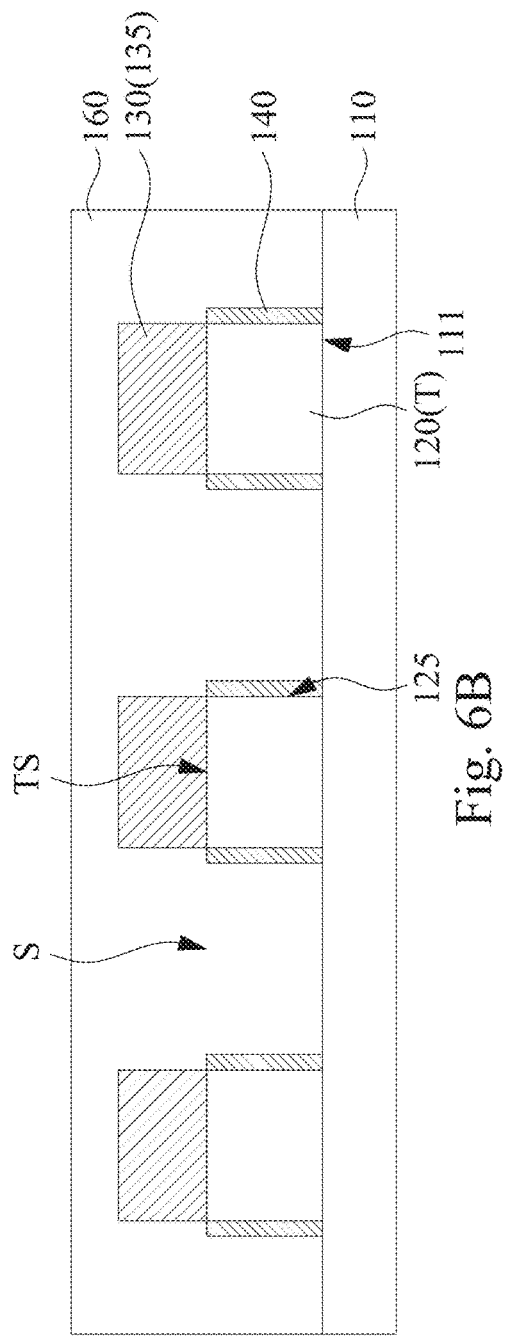

Reference is made to FIG. 6B, which is a schematic cross-sectional view of a touch sensor 100b according to some other embodiments of the present disclosure, in which the cross-sectional position of FIG. 6B corresponds to the position taken along the line A-A' shown in FIG. 1A. At least one difference between the touch sensor 100b shown in FIG. 6B and the touch sensor 100 shown in FIG. 1B is that there is no insulating portion 150 in the touch sensor 100b of FIG. 6B. Therefore, the substrate 110 is exposed by the gap S between the transitional insulating portions 140, and the transitional insulating portion 140 further extends along the sidewall 125 of the wiring portion T until the transitional insulating portion 140 reaches the main surface 111 of the substrate 110. In detail, in some embodiments, the surface treatment process (including at least one chemical cleaning process and at least one argon plasma treatment process, which can reference FIG. 3E and FIG. 3F) can completely remove the matrix M in the metal nanowire material layer 220 that is not located in the vertical projection area of the patterned photoresist layer 240 (wiring pattern TP) while leaving the metal nanowires SNW in the etching region Q. Therefore, the substrate 110 corresponding to the etching region Q can be exposed between the metal nanowires SNW in the etching region Q. Next, during the second etching process (FIG. 3G), the matrix M in the metal nanowire material layer 220 located in the vertical projection area of the wiring pattern TP but not covered by the silver wiring structure 135 will form a transitional insulating portion 140, thereby forming the transitional insulating portion 140 extending from the upper surface TS of the wiring portion T to the main surface 111 of the substrate 110 along the sidewall 125 of the wiring portion T.

In addition, in this embodiment, the substrate 110 and the transitional insulating portion 140 also form a stepped structure. Furthermore, in this embodiment, the protection layer 160 filled in the gap S is further in contact with the main surface 111 of the substrate 110. Since in this embodiment, the matrix M located in the etching region Q has been removed before the second etching process, the metal nanowires SNW located in the etching region Q can be directly exposed in the second etching process and are more easily removed, thereby reducing the probability of short circuits due to incomplete etching.

Figure 6C:
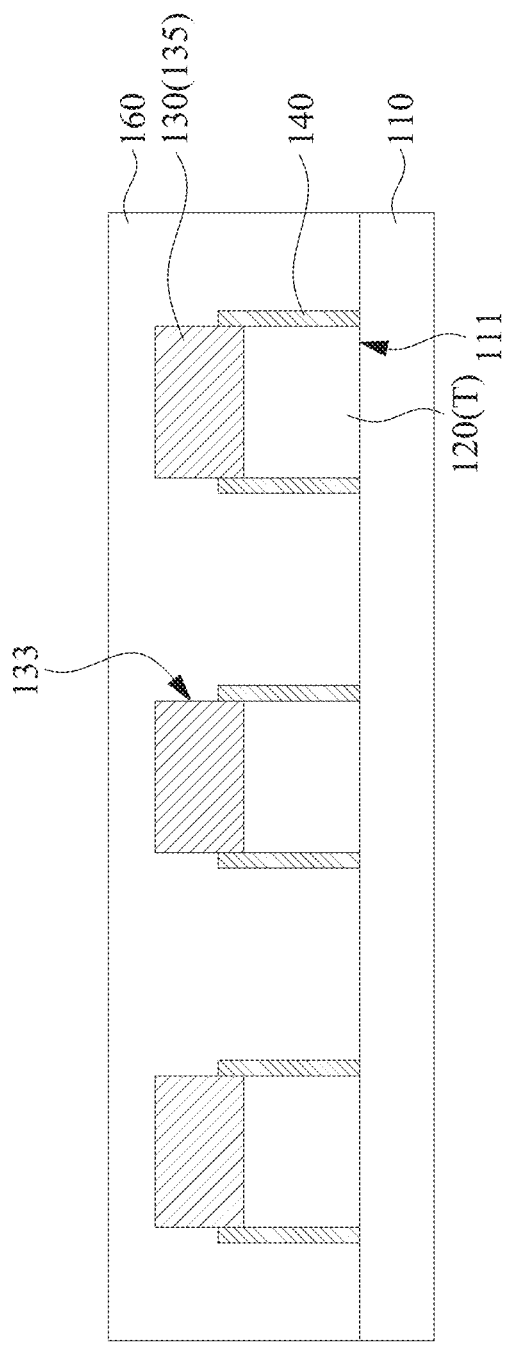

Reference is made to FIG. 6C, which is a schematic cross-sectional view of a touch sensor 100c according to some other embodiments of the present disclosure, in which the cross-sectional position of FIG. 6C corresponds to the position taken along the line A-A' shown in FIG. 1A. At least one difference between the touch sensor 100c shown in FIG. 6C and the touch sensor 100 shown in FIG. 1B is that in the touch sensor 100c of FIG. 6C, the transitional insulating portion 140 further extends to a portion of the sidewall 133 of the silver layer 130 (silver wiring structure 135). The cause of such formation can be referenced in the description of FIG. 6A mentioned above and will not be repeated hereinafter.

According to the aforementioned embodiments of the present disclosure, the design of the touch sensor of the present disclosure helps to form the peripheral traces with small line width and line spacing and realize the narrow bezel design of the touch sensor. In addition, through the design of the transitional insulating portion, the peripheral trace formed by the overlapping of the wiring portion and the silver layer can be provided with better stability. Furthermore, based on the stacked-structure design of the touch sensor of the present disclosure, during the manufacturing process of the touch sensor, by forming the touch electrode and the peripheral trace at once through a single exposure and development process, the steps of the manufacturing process can be reduced, the cost can be reduced, and the etching precision can be improved to facilitate the formation of peripheral traces with small line width and line spacing.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure covers modifications and variations of this disclosure provided they fall within the scope of the following claims.

What is claimed is:

1. A touch sensor having a visible area and a peripheral area adjacent to at least one side of the visible area, the touch sensor comprising:
    a substrate;
    a metal nanowire layer disposed on a main surface of the substrate, wherein the metal nanowire layer defines a plurality of electrode portions corresponding to the visible area and defines a plurality of wiring portions corresponding to the peripheral area, the wiring portions are respectively connected to the electrode portions and are arranged at intervals, and two adjacent wiring portions of the wiring portions are spaced apart by a spaced region;
    a transitional insulating portion disposed in the spaced region, wherein the transitional insulating portion is adjacent and connected to a sidewall of each of the wiring portions, and a gap is between two of the transitional insulating portions that are adjacent and respectively connected to two adjacent wiring portions of the wiring portions; and
    a silver layer disposed on the wiring portions and being in contact with a top surface of the wiring portions, wherein the silver layer and the wiring portions together constitute a plurality of peripheral traces of the touch sensor.

2. The touch sensor of claim 1, wherein the transitional insulating portion has a plurality of pores.

3. The touch sensor of claim 1, further comprising:
    an insulating portion disposed in the spaced region, wherein the transitional insulating portion is disposed on and in contact with a top surface of the insulating portion.

4. The touch sensor of claim 3, wherein a surface roughness of the top surface of the insulating portion is greater than a surface roughness of a top surface of the transitional insulating portion.

5. The touch sensor of claim 3, wherein the insulating portion and the transitional insulating portion together constitute a stepped structure.

6. The touch sensor of claim 3, wherein a material of the transitional insulating portion is the same as a material of the insulating portion, and the insulating portion has a plurality of pores.

7. The touch sensor of claim 3, wherein the metal nanowire layer and the transitional insulating portion comprise a matrix, and the metal nanowire layer comprises a plurality of metal nanowires distributed in the matrix.

8. The touch sensor of claim 1, wherein a width of the transitional insulating portion is larger than or equal to 0.25 μm and smaller than or equal to 3.5 μm.

9. The touch sensor of claim 1, wherein the transitional insulating portion extends to a sidewall of the silver layer.

10. The touch sensor of claim 1, further comprising:
    a protection layer filled in the gap and covering the metal nanowire layer, the transitional insulating portion, and the silver layer.

11. A manufacturing method of a touch sensor having a visible area and a peripheral area adjacent to at least one side of the visible area, the manufacturing method comprising:
    forming a metal nanowire material layer on a main surface of a substrate, wherein the metal nanowire material layer corresponds to the visible area and the peripheral area;
    forming a silver material layer on the metal nanowire material layer and corresponding to the peripheral area;
    forming a photoresist layer to cover the metal nanowire material layer and the silver material layer;
    performing an exposure and development process to pattern the photoresist layer, wherein the photoresist layer, which is patterned, defines a wiring pattern corresponding to the peripheral area;
    performing a first etching process to etch the silver material layer through the wiring pattern, thereby forming a silver wiring structure;
    performing a surface treatment process to at least remove a portion of a residual resin corresponding to the peripheral area through the wiring pattern, wherein the residual resin is left by the silver material layer that has undergone the first etching process, and to remove a portion of the metal nanowire material layer corresponding to the peripheral area;

performing a second etching process to etch the metal nanowire material layer through the wiring pattern, thereby forming a plurality of wiring portions, a spaced region between two adjacent wiring portions of the wiring portions, and a transitional insulating portion in the spaced region and adjacent and connected to a sidewall of each of the wiring portions; and removing the photoresist layer.

12. The manufacturing method of the touch sensor of claim 11, wherein the first etching process is performed such that a width of the silver wiring structure is smaller than a width of the wiring pattern.

13. The manufacturing method of the touch sensor of claim 11, wherein the surface treatment process completely removes the residual resin left by the silver material layer that has undergone the first etching process, such that a top surface of the transitional insulating portion is coplanar with an upper surface of the wiring portion.

14. The manufacturing method of the touch sensor of claim 11, wherein the surface treatment process partially removes the residual resin left by the silver material layer that has undergone the first etching process, such that a top surface of the transitional insulating portion is higher than an upper surface of the wiring portion, and the transitional insulating portion extends to a sidewall of the silver wiring structure.

15. The manufacturing method of the touch sensor of claim 11, wherein the metal nanowire material layer comprises a matrix and a plurality of metal nanowires distributed in the matrix, and the surface treatment process completely removes the matrix of the metal nanowire material layer that is not located in a vertical projection area of the photoresist layer that is patterned, such that the substrate is exposed between the metal nanowires.

16. The manufacturing method of the touch sensor of claim 15, wherein the transitional insulating portion extends to the main surface of the substrate.

17. The manufacturing method of the touch sensor of claim 11, wherein the metal nanowire material layer comprises a matrix and a plurality of metal nanowires distributed in the matrix, and the surface treatment process partially removes the matrix of the metal nanowire material layer that is not located in a vertical projection area of the photoresist layer that is patterned such that the matrix that is not removed forms an insulating portion during the second etching process.

18. The manufacturing method of the touch sensor of claim 17, wherein the second etching process is performed such that the insulating portion has a plurality of pores.

19. The manufacturing method of the touch sensor of claim 11, wherein the surface treatment process sequentially comprises a chemical cleaning process and an argon plasma treatment process.

20. The manufacturing method of the touch sensor of claim 19, wherein the argon plasma treatment process is carried out in a direction perpendicular to the main surface of the substrate with the wiring pattern as a mask.

* * * * *